United States Patent [19]
Leussler

[11] Patent Number: 5,917,324
[45] Date of Patent: Jun. 29, 1999

[54] MR APPARATUS PROVIDED WITH A CYLINDRICAL COIL SYSTEM AND A SURFACE COIL SYSTEM

[75] Inventor: Christoph G. Leussler, Hamburg, Germany

[73] Assignee: U.S. Philips Corporation, New York, N.Y.

[21] Appl. No.: 08/842,290

[22] Filed: Apr. 23, 1997

[30] Foreign Application Priority Data

Apr. 25, 1996 [DE] Germany .............................. 196 16 464

[51] Int. Cl.⁶ ....................................................... G01V 3/00
[52] U.S. Cl. ............................................ 324/318; 324/322
[58] Field of Search .................................... 324/318, 322, 324/314, 312, 307, 309, 300

[56] References Cited

U.S. PATENT DOCUMENTS

| | | | |
|---|---|---|---|
| 5,003,265 | 3/1991 | Leussler | 324/318 |
| 5,285,160 | 2/1994 | Loos et al. | 324/318 |
| 5,510,714 | 4/1996 | Takahashi et al. | 324/318 |
| 5,552,707 | 9/1996 | Takahashi et al. | 324/318 |

FOREIGN PATENT DOCUMENTS

0616229A1  9/1994  European Pat. Off. .

*Primary Examiner*—Louis Arana
*Attorney, Agent, or Firm*—Dwight H. Renfrew, Jr.

[57] ABSTRACT

An MR apparatus which includes a cylindrical coil system and a surface coil system. In order to form a coherent MR image of an as large as possible examination zone by means of an MR apparatus, without necessitating the use of a larger number of receiving channels with respect to a conventional MR apparatus, the cylindrical coil system, for example a bird-cage resonator, and the surface coil system, for example a quadrature coil system, are arranged to overlap and the magnitude of the region of overlap can be varied in order to reduce mutual coupling.

19 Claims, 2 Drawing Sheets

MR APPARATUS PROVIDED WITH A CYLINDRICAL COIL SYSTEM AND A SURFACE COIL SYSTEM

BACKGROUND OF THE INVENTION

1. Field of the Invention

The invention relates to an MR apparatus for the reception of MR signals from an examination zone, exposed to a steady, uniform magnetic field and superposed gradient magnetic fields, after excitation by an RF magnetic field, using an MR coil system which includes a cylindrical coil system and a surface coil system.

2. Description of the Related Art

A magnetic resonance (MR) apparatus of this kind is known from EP-A 616 229. Therein, MR signals are received simultaneously from a plurality of regions of the body of a patient by means of a plurality of coil systems. The cylindrical coil system therein is, for example a bird-cage resonator conceived for examination of the head, while the surface coil system is, for example a quadrature coil system arranged on the chest of the patient. MR images of the head and chest regions can thus be formed during an examination. Generally speaking, a cylindrical coil system is to be understood to mean a coil system which has a cylindrical construction and encloses one or more parts of the body of the patient during an MR examination. The cylindrical coil system exhibits an essentially uniform sensitivity in the enclosed region and usually only one channel is required for the reception of the MR signals measured by the cylindrical coil system. A surface coil system, or surface coils incorporated therein, are to be understood to mean coils which are arranged on or in the vicinity of the surface of the body of a patient but do not enclose the body or parts of the body. Surface coils of this kind have a locally higher signal-to-noise ratio but also have a distinctly non-uniform sensitivity. One or two of such surface coils together usually require its own receiving channel.

SUMMARY OF THE INVENTION

It is an object of the present invention to achieve a further improvement of an MR apparatus of the kind set forth.

This object is achieved according to the invention in that the cylindrical coil system and the surface coil system overlap in a region of overlap and in that the MR apparatus includes means for adjusting the magnitude of the region of overlap.

It has been found that a high degree of decoupling of the two coil systems from one another can be achieved when the two coil systems overlap. It has also been found that the magnitude of the region of overlap has a pronounced effect on the strength of the coupling. Therefore, according to the invention there are provided means enabling variation of the magnitude of the region of overlap prior to or during the examination. Prior to the examination, for example a phantom body (for example, a container filled with water) could be arranged in the examination zone and the region of overlap could be varied until the best signal-to-noise ratio is obtained. This could also take place at the beginning of the examination of a patient, which would have the advantage that the anatomy of the patient's body is directly taken into account during the adjustment of the best signal-to-noise ratio.

The MR apparatus according to the invention enables a coherent MR image to be obtained of a comparatively large region; to this end it requires only a limited number of receiving channels, as opposed to a device comprising a plurality of surface coils covering a region of equal magnitude which would require a substantially larger number of receiving channels. Adequate homogeneity and a suitably high signal-to-noise ratio are also ensured, because couplings between the coil systems are eliminated to a high degree by the invention. A further advantage of the invention resides in the fact that conventional coil systems can be used for the cylindrical coil system as well as for the surface coil system, merely minor structural modifications being required for the purpose of the invention.

In a further embodiment of the invention the cylindrical coil system includes at least a bird-cage resonator, a saddle coil system, a solenoid coil system or a loop-array coil system. A bird-cage resonator is known from the cited EP-A 616 229 and a loop-array coil system, consisting of a plurality of inductively coupled loops, is known from U.S. Pat. No. 5,003,265. A saddle coil system consists, for example of two individual, so-called saddle coils which are constructed as loops and each of which covers a respective half of the circumference of a body or a part of a body on opposite sides. A solenoid coil system is a coil system in the form of a spiral.

The surface coil system in a further embodiment of the invention includes at least one surface coil which is adapted at least locally to the body surface of a patient. Such surface coils have a particularly attractive signal-to-noise ratio in the body region they cover. In a surface coil system comprising a plurality of surface coils, neighboring surface coils also overlap in order to reduce the mutual coupling. Means for changing the magnitude of the region of overlap can then also be provided.

The cylindrical coil system in a preferred embodiment of the invention is constructed so that it can enclose the head of a patient with a small clearance, the surface coil system being constructed so that it can be adapted to the chest and/or neck regions of a patient. MR images, for example sagittal or coronal slice images, can thus be formed of a portion of the patient extending from the top of the head as far as the heart. A practical embodiment has a field of view having a length of approximately 45 cm.

The means for adjusting the magnitude of the region of overlap in a further embodiment according to the invention include a rail device which enables displacement of the surface coil system relative to the cylindrical coil system. This is a structurally simple and inexpensive solution which can also be used for simply extending conventional coil systems. However, means other than a rail device are also feasible for the displacement of the surface coil system relative to the cylindrical coil system in an MR apparatus according to the invention. There may also be provided a displacement blocking device which prevents variation of the region of overlap once the optimum magnitude of the region of overlap has been found. This device could be, for example a locking screw or a mechanical latch.

In a further embodiment of the invention the dimensions of the surface coils included in the surface coil system can be varied. It has been found that the region of overlap must be smaller as the side of a surface coil neighboring the cylindrical coil system is wider. Thus, once a region of overlap has been fixed, the signal-to-noise ratio could be optimized by variation of the dimensions, notably the width, of a surface coil. It would also be feasible to vary the magnitude of the region of overlap as well as the dimensions of the surface coil. By variation of the dimensions of the surface coil, the field of view of the surface coil could also be adapted, during or directly before the examination, to the requirements imposed by the desired image or the anatomy of the patient's body.

This object is also achieved by means of an MR coil system which includes a cylindrical coil system and a surface coil system and is characterized in that the cylindrical coil system and the surface coil system overlap in a region of overlap, and that the MR coil system comprises means for adjusting the magnitude of the region of overlap.

BRIEF DESCRIPTION OF THE DRAWING

The invention will be described in detail hereinafter with reference to the drawing. Therein.

DESCRIPTION OF THE PREFERRED EMBODIMENT

Figure 1:
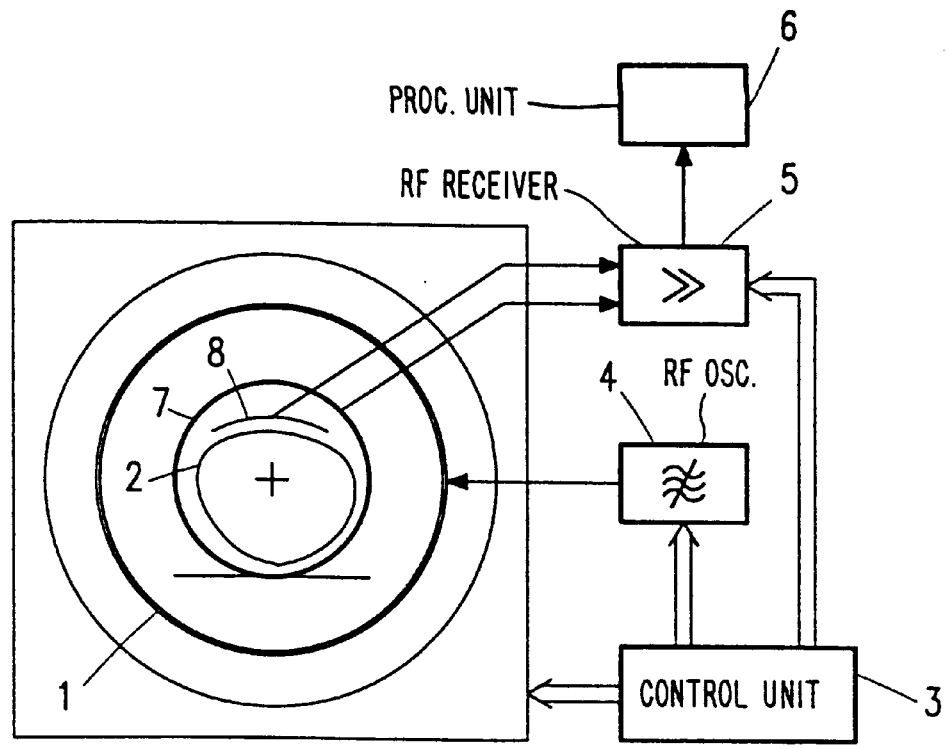
FIG. 1 shows a block diagram of an MR apparatus according to the invention.

The MR apparatus shown in FIG. 1 includes an RF coil system 1 of hollow-cylindrical cross-section which generates in its interior an RF magnetic field which extends perpendicularly to the plane of drawing and traverses the examination zone in which there is arranged a patient 2 whose longitudinal body axis extends perpendicularly to the plane of drawing. The MR apparatus also includes a main field magnet (not shown) which generates a steady, uniform magnetic field which extends perpendicularly to the plane of drawing. The MR apparatus also includes gradient coils (not shown) which generate magnetic fields which also extend perpendicularly to the plane of drawing but have a gradient in a respective one of three mutually perpendicular directions. The generating of the above fields is controlled by a control unit 3. This unit controls specifically an oscillator 4 which is connected to the RF coil system 1 and provides the RF excitation in the transmission mode. The control unit 3 also controls an RF receiver 5 which is connected to various receiving coils and amplifies, demodulates and digitizes the spin resonance signals received. The signals are subsequently processed in the processing unit 6. This figure shows the receiving coils as a cylindrical coil system 7, cylindrically enclosing a part of the body of the patient 2, and as a surface coil system 8 which covers a part of the surface of the body of the patient.

Figure 2:
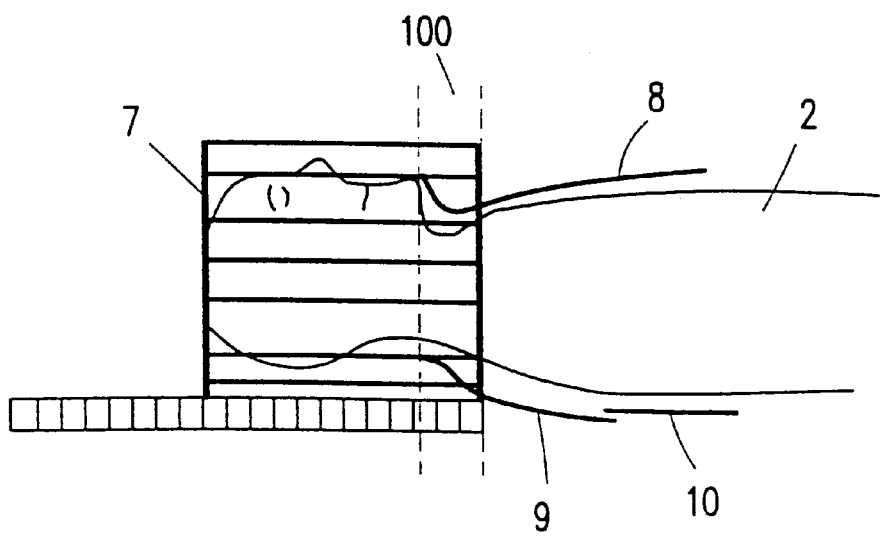
FIG. 2 shows an embodiment of an MR apparatus according to the invention for the head and chest regions.

FIG. 2 shows an embodiment of the invention for the formation of coherent MR images of the head and chest regions of a patient 2. The cylindrical coil system in this case consists of a known bird-cage resonator 7 which completely encloses the head of a patient 2 as far down as the neck. Using such a bird-cage resonator 7, MR images can be formed of the head; only a single receiving channel need be provided in the receiver for this purpose. In the region of the chest of the patient 2 a first surface coil 8 is arranged on the body surface, the shape of said surface coil being adapted to the body surface notably at the area of the neck. The surface coil 8 and the bird-cage resonator 7 overlap in a region of overlap 100, i.e. the surface coil 8 projects partly into the space enclosed by the bird-cage 7. At the region of the neck and the shoulders of the patient 2 there is provided a further surface coil 9, also adapted to the body surface. This surface coil is also overlapped by the bird-cage resonator 7, i.e. it also projects partly into the interior thereof. At the region of the back of the patient 2 there is provided a further surface coil 10 which is overlapped partly by the surface coil 9. Overall four receiving channels are required for the MR apparatus shown. The surface coils 8, 9, 10 in the embodiment shown are formed by a respective, single wire loop. The part of the surface area of the surface coils 8 and 9 which is overlapped by the bird-cage resonator 7 in practice amounts to from approximately 10% to 20% of the overall surface area of the surface coils 8, 9. The width of the region of overlap is in the range of a few centimeters. The magnitude of the region of overlap, however, is also dependent on the type, the construction and the dimensions of the coils as well as on the anatomy of the patient.

Figure 3:
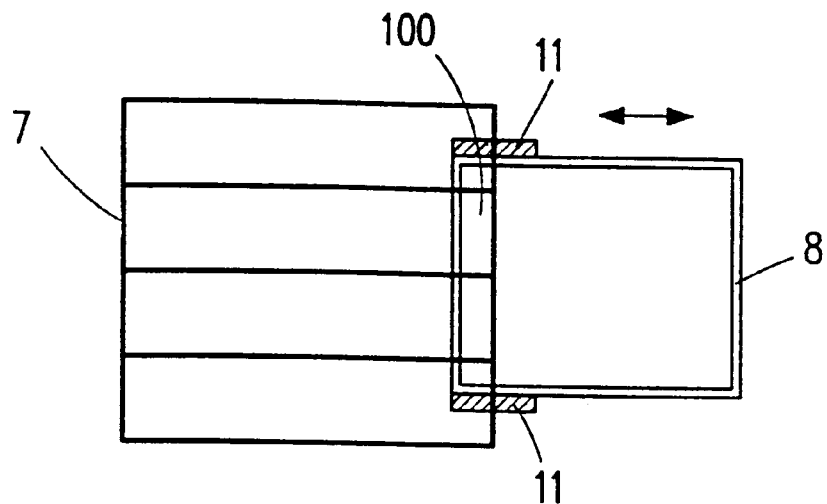
FIG. 3 is a plan view of a part of the MR apparatus shown in FIG. 2.

FIG. 3 is a plan view of a part of the embodiment shown in FIG. 2. The region of overlap 100 of the bird-cage resonator 7 and the surface coil 8 can be clearly recognized. The reference numeral 11 denotes a rail device which is mounted to both sides of the surface coil 8 and slides in a rail provided on the bird-cage resonator 7 (not shown). As a result, the surface coil 8 can be displaced relative to the bird-cage resonator 7 in the direction denoted by the double arrow, the magnitude of the region of overlap 100 thus being changed.

Figure 4:
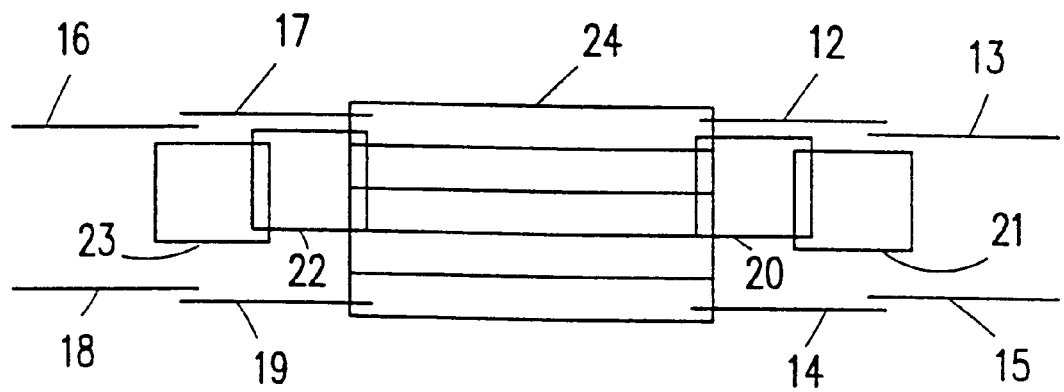
FIG. 4 shows a further embodiment of an MR apparatus according to the invention.

FIG. 4 shows an alternative embodiment of an MR apparatus according to the invention. It includes a bird-cage resonator 24 as well as a plurality of surface coils 12 to 23. The surface coils 12, 14, 17, 19, 20, 22 which neighbor the bird-cage resonator 24 are again overlapped by the bird-cage resonator 24. The further surface coils 13, 15, 16, 18, 21, 23 are overlapped by the respective neighboring surface coil. The embodiment shown is suitable, for example for the formation of MR images of a complete leg of a patient. The bird-cage resonator 24 is then arranged, for example around the knee and the surface coils are distributed across the high and the lower leg. In order to reduce the number of receiving channels, the received signals of each time two surface coils can also be received and processed via one channel, after appropriate processing by means of a combination circuit, so that in this embodiment seven receiving channels are required.

Arbitrary other embodiments can be derived from the embodiment shown in FIG. 4. For example, in the embodiment shown in FIG. 4 a further bird-cage resonator or a saddle coil system may be provided in the end region, which further system encloses the foot of the patient. Also feasible are two or more mutually partly overlapping cylindrical coil systems.

In addition to the rectangular loops shown, elliptical or circular loops, quadrature coils or butterfly coils may also be used as surface coils. The surface coil system may consist of a combination of several, different surface coils, in which case a plurality of surface coils, for example a loop and a butterfly coil, may also be arranged one over the other so as to cover approximately the same region of the body surface. The construction of the cylindrical coil system may also deviate from the embodiments shown. For example, the bird-cage may also have an elliptical cross-section and/or be provided with a conductive end surface and/or shoulder openings.

Additional, further decoupling between the surface coil system and the cylindrical coil system can be achieved by means of a capacitive network arranged between the two coil systems if adequate enhancement of the decoupling by variation of the magnitude of the region of overlap is not possible, for example for reasons of construction.

I claim:

1. An MR apparatus for the reception of MR signals from an examination zone exposed to a steady, uniform magnetic field and superposed gradient magnetic fields, after excitation by an RF magnetic field, using an MR coil system comprising a cylindrical coil system, a surface coil system, wherein the cylindrical coil system and the surface coil system overlap at most partially in a region of overlap in order to decouple the surface coil system and the cylindrical coil system, and means for adjusting the magnitude of the at most partial overlap of the cylindrical coil system and the surface coil system.

2. An MR apparatus as claimed in claim 1, characterized in that the cylindrical coil system includes at least a birdcage resonator, a saddle coil system, a solenoid coil system or a loop-array coil system.

3. An MR apparatus as claimed in claim 2, characterized in that the surface coil system includes at least one surface coil which is adapted at least locally to the body surface of a patient.

4. An MR apparatus as claimed in claim 3, characterized in that the cylindrical coil system is constructed so that it can enclose the head of a patient with a small clearance, the surface coil system being constructed so that it can be adapted to the chest and/or neck regions of a patient.

5. An MR apparatus as claimed in claim 3, characterized in that the means for adjusting the magnitude of the region of overlap include a rail device which enables displacement of the surface coil system relative to the cylindrical coil system.

6. An MR apparatus as claimed in claim 2, characterized in that the cylindrical coil system is constructed so that it can enclose the head of a patient with a small clearance, the surface coil system being constructed so that it can be adapted to the chest and/or neck regions of a patient.

7. An MR apparatus as claimed in claim 2, characterized in that the means for adjusting the magnitude of the region of overlap include a rail device which enables displacement of the surface coil system relative to the cylindrical coil system.

8. An MR apparatus as claimed in claim 1, characterized in that the surface coil system includes at least one surface coil which is adapted at least locally to the body surface of a patient.

9. An MR apparatus as claimed in claim 8, characterized in that the cylindrical coil system is constructed so that it can enclose the head of a patient with a small clearance, the surface coil system being constructed so that it can be adapted to the chest and/or neck regions of a patient.

10. An MR apparatus as claimed in claim 8, characterized in that the means for adjusting the magnitude of the region of overlap include a rail device which enables displacement of the surface coil system relative to the cylindrical coil system.

11. An MR apparatus as claimed in claim 1, characterized in that the cylindrical coil system is constructed so that it can enclose the head of a patient with a small clearance, the surface coil system being constructed so that it can be adapted to the chest and/or neck regions of a patient.

12. An MR apparatus as claimed in claim 11, characterized in that the means for adjusting the magnitude of the region of overlap include a rail device which enables displacement of the surface coil system relative to the cylindrical coil system.

13. An MR apparatus as claimed in claim 1, characterized in that the means for adjusting the magnitude of the region of overlap include a rail device which enables displacement of the surface coil system relative to the cylindrical coil system.

14. An MR apparatus as claimed in claim 1, characterized in that the dimensions of the surface coils included in the surface coil system can be varied.

15. The MR apparatus of claim 1 wherein the magnitude of the at most partial overlap of the cylindrical coil system and the surface coil system is no more than approximately 20% of the area of a surface coil of the surface coil system.

16. The MR apparatus of claim 1 wherein the magnitude of the at most partial overlap of the cylindrical coil system and the surface coil system is that at which the best signal-to-noise ratio is obtained.

17. An MR coil system comprising a cylindrical coil system, a surface coil system wherein the cylindrical coil system and the surface coil system overlap at most partially in a region of overlap in order to decouple the surface coil system and the cylindrical coil system, and means for adjusting the magnitude of the at most partial overlap of the cylindrical coil system and the surface coil system.

18. The MR coil system of claim 17 wherein the magnitude of the at most partial overlap of the cylindrical coil system and the surface coil system is no more than approximately 20% of the area of a surface coil of the surface coil system.

19. The MR coil system of claim 17 wherein the magnitude of the at most partial overlap of the cylindrical coil system and the surface coil system is that at which the best signal-to-noise ratio is obtained.

* * * * *